(12) United States Patent
Miyazaki et al.

(10) Patent No.: US 8,119,257 B2
(45) Date of Patent: Feb. 21, 2012

(54) ORGANIC ELECTROLUMINESCENT DEVICE

(75) Inventors: Hiroshi Miyazaki, Kitakyushu (JP); Natsumi Henzan, Kitakyushu (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 936 days.

(21) Appl. No.: 12/083,976

(22) PCT Filed: Oct. 10, 2006

(86) PCT No.: PCT/JP2006/320177
§ 371 (c)(1),
(2), (4) Date: Apr. 23, 2008

(87) PCT Pub. No.: WO2007/052444
PCT Pub. Date: May 10, 2007

(65) Prior Publication Data
US 2009/0128011 A1    May 21, 2009

(30) Foreign Application Priority Data

Oct. 31, 2005  (JP) .................................. 2005-316223
Oct. 31, 2005  (JP) .................................. 2005-316224

(51) Int. Cl.
*H01L 51/54* (2006.01)
(52) U.S. Cl. ........ 428/690; 428/917; 313/504; 313/506; 252/301.16; 257/40; 257/102; 257/103; 257/E51.043
(58) Field of Classification Search ............ 257/E51.043
See application file for complete search history.

(56) References Cited

U.S. PATENT DOCUMENTS

| | | | | |
|---|---|---|---|---|
| 6,630,253 | B1 * | 10/2003 | Tanaka et al. ................. | 428/690 |
| 2003/0116788 | A1 * | 6/2003 | Sakakibara et al. .......... | 257/200 |
| 2005/0191519 | A1 | 9/2005 | Mishima et al. | |
| 2006/0063030 | A1 | 3/2006 | Deaton et al. | |

FOREIGN PATENT DOCUMENTS

| | | |
|---|---|---|
| JP | 2001-313178 A | 11/2001 |
| JP | 2002-299061 A | 10/2002 |
| JP | 2002-352957 A | 12/2002 |
| JP | 2003-7467 A | 1/2003 |
| JP | 2003-515897 A | 5/2003 |
| JP | 2005-276799 A | 10/2005 |

* cited by examiner

*Primary Examiner* — Jennifer Chriss
*Assistant Examiner* — Michael H Wilson
(74) *Attorney, Agent, or Firm* — Birch, Stewart, Kolasch & Birch, LLP

(57) ABSTRACT

Disclosed is an organic electroluminescent device (organic EL device) utilizing phosphorescence which is improved in luminous efficiency and sufficiently secured of driving stability. The organic EL device comprises an anode 2, organic layers containing a hole-transporting layer 4, a light-emitting layer 5, and an electron-transporting layer 6, and a cathode 7 piled one upon another on a substrate 1, the hole-transporting layer is disposed between the light-emitting layer and the anode, the electron-transporting layer is disposed between the light-emitting layer and the cathode, and the light-emitting layer comprises an organic Al complex represented by the following general formula (I) as a host material and an organic Ir complex represented by the following general formula (II) as a guest material. In formula (I), L is ArO—, ArCOO—, $Ar_3SiO$—, $Ar_3GeO$—, or $Ar_2AlO$—.

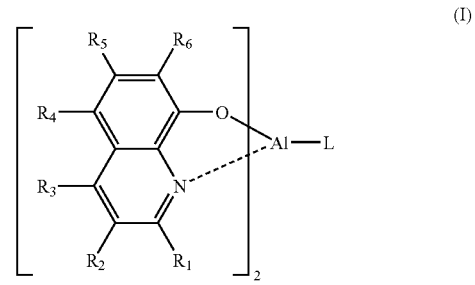

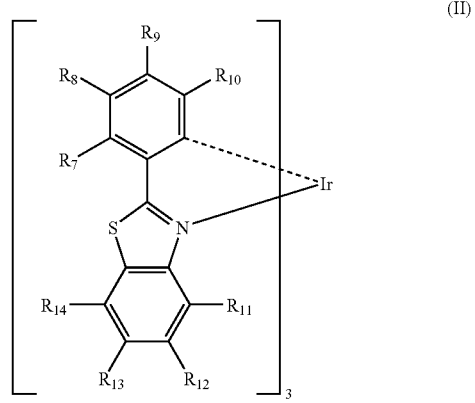

6 Claims, 1 Drawing Sheet

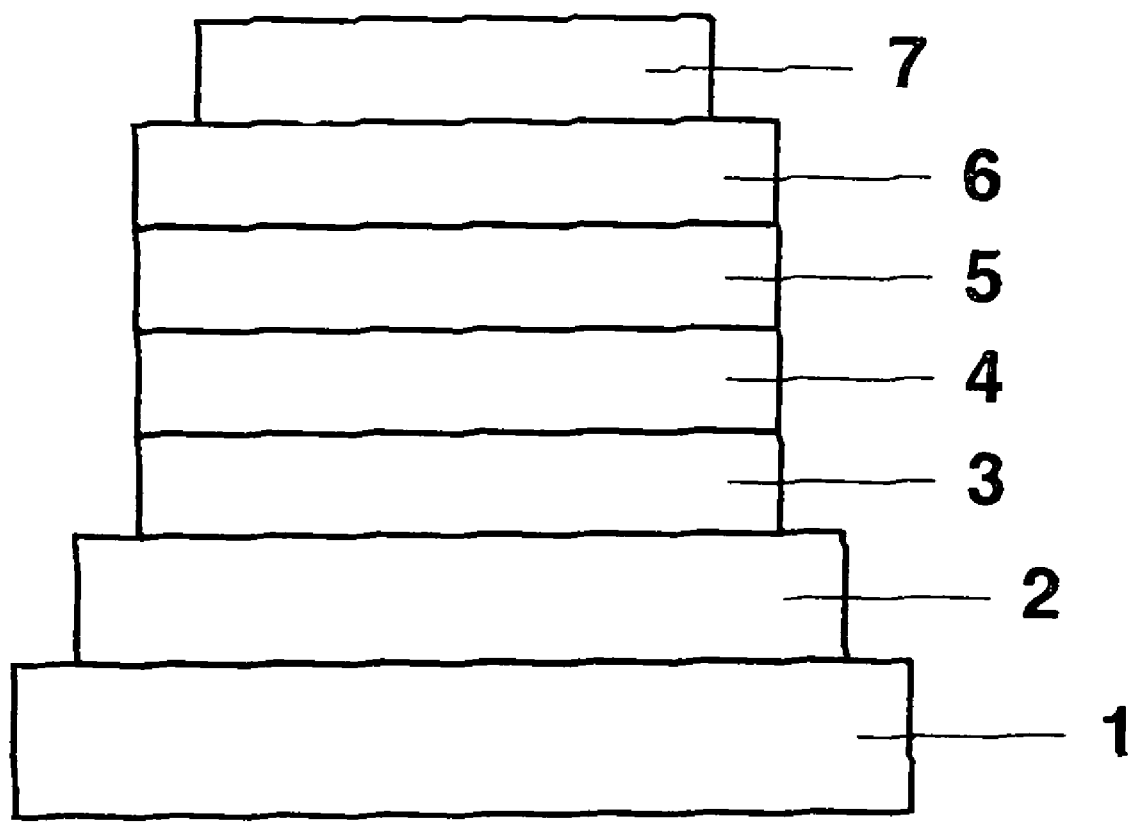

ORGANIC ELECTROLUMINESCENT DEVICE

TECHNICAL FIELD

This invention relates to an organic electroluminescent device (hereinafter referred to as an organic EL device) and, more particularly, to a thin film type device which emits light on application of an electrical field to a light-emitting layer comprising organic compounds.

BACKGROUND TECHNOLOGY

In the development of an electroluminescent device utilizing organic materials, a device developed by optimizing the kind of electrodes and disposing a hole-transporting layer comprising an aromatic diamine and a light-emitting layer comprising 8-hydroxyquinoline aluminum complex (hereinafter referred to as Alq3) between the electrodes for the purpose of improving the efficiency of injecting electrical charges from the electrodes has brought about a noticeable improvement in luminous efficiency over the conventional devices utilizing single crystals of anthracene and the like. Following this, the developmental works of organic EL devices have been focused on their commercial applications to high-performance flat panels characterized by self luminescence and high-speed response.

In order to improve still further the efficiency of an organic EL device such as this, the aforementioned basic structure of anode/hole-transporting layer/light-emitting layer/cathode has been modified by suitably adding a hole-injecting layer, an electron-injecting layer, and an electron-transporting layer. For example, the following structures are known; anode/hole-injecting layer/hole-transporting layer/light-emitting layer/cathode, anode/hole-injecting layer/light-emitting layer/electron-transporting layer/cathode, anode/hole-injecting layer/light-emitting layer/electron-transporting layer/electron-injecting layer/cathode, and anode/hole-injecting layer/hole-transporting layer/light-emitting layer/hole-blocking layer/electron-transporting layer/cathode. The hole-transporting layer has a function of transporting the holes injected from the hole-injecting layer to the light-emitting layer while the electron-transporting layer has a function of transporting the electrons injected from the cathode to the light emitting layer. The hole-injecting layer is sometimes called an anode buffer layer and the electron-injecting layer a cathode buffer layer.

The hole-transporting layer interposed between the light-emitting layer and the hole-injecting layer injects more holes into the light-emitting layer by application of lower electrical field; moreover, the electrons injected into the light-emitting layer from the cathode or from the electron-transporting layer accumulate in the light-emitting layer as the hole-transporting layer obstructs the flow of electrons and, as a result, the luminous efficiency improves.

Likewise, the electron-transporting layer interposed between the light-emitting layer and the electron-injecting layer injects more electrons into the light-emitting layer by application of lower electrical field; moreover, the holes injected into the light-emitting layer from the anode or from the hole-transporting layer accumulate in the light-emitting layer as the electron-transporting layer obstructs the flow of holes and, as a result, the luminous efficiency improves. A large number of organic materials have been developed to perform the function of the constituent layers.

The aforementioned device comprising a hole-transporting layer of an aromatic diamine and a light-emitting layer of Alq3 and many others have utilized fluorescence. Now, the utilization of phosphorescence, that is, emission of light from the triplet excited state, is expected to enhance the luminous efficiency approximately three times that of the conventional devices utilizing fluorescence (singlet). To achieve this object, studies were conducted on the use of coumarin derivatives and benzophenone derivatives for the light-emitting layer, but the result was nothing but extremely low luminance. Thereafter, the use of europium complexes was attempted in trial utilization of the triplet excited state, but it failed to produce high luminous efficiency.

According to a recent report, a device using a platinum complex (PtOEP) can undergo red phosphorescence at high efficiency. Thereafter, a device capable of undergoing green phosphorescence at high efficiency has been fabricated by doping the light-emitting layer with an iridium complex [Ir(ppy)3].

This iridium complex has been found to emit light in a wide wavelength range from blue to red by varying the chemical structure of the ligand. However, it has become evident that a tris complex which is regarded as the most stable complex can be prepared only from a limited number of ligands. To overcome this difficulty, a hetero complex prepared from iridium chloride via an intermediate of cross-linked structure has been proposed (Proceeding of SPIE, vol. 4105, p. 119).

The prior-art documents relating to this invention are listed below.
Patent document 1: JP2002-299061 A
Patent document 2: JP2001-313178 A
Patent document 3: JP2002-352957 A
Patent document 4: JP2003-515897 A
Non-patent document 1: Appl. Phys. Lett., vol. 77, p. 904

In the development of organic EL devices utilizing phosphorescence, 4,4'-bis(9-carbazolyl)biphenyl (hereinafter referred to as CBP) is used as a host material as cited in the patent document 2. However, the use of CBP as a host material for tris(2-phenylpyridine)iridium complex (hereinafter referred to as Ir(ppy)3) that is a phosphorescent material emitting green light destroys the balanced injection of electrical charges as CBP has a property of facilitating the flow of holes and obstructing the flow of electrons and excess holes flow out to the side of the electron-transporting layer to lower the luminous efficiency from Ir(ppy)3.

As a means to solve the aforementioned problem, a hole-blocking layer may be disposed between the light-emitting layer and the electron-transporting layer. The hole-blocking layer accumulates holes in the light-emitting layer efficiently, improves the probability of recombination of holes and electrons in the light-emitting layer, and enhances the luminous efficiency. The hole-blocking materials currently in general use include 2,9-dimethyl-4,7-diphenyl-1,10-phenanthroline (hereinafter referred to as BCP) and p-phenylphenolato-bis(2-methyl-8-quinolinolato-N1,O8)aluminum (hereinafter referred to as BAlq). A hole-blocking material such as this can prevent electrons and holes from recombining in the electron-transporting layer. However, BCP tends to crystallize easily at room temperature and a device comprising BCP lacks reliability and shows an extremely short life. On the other hand, BAlq is reported to show a relatively long life, but lacks a sufficient hole-blocking ability and lowers the luminous efficiency from Ir(ppy)3. In addition, an increase of one layer complicates the layered structure of the device and increases the cost.

The use of 3,5-diphenyl-4-(1-naphthyl)-1,2,4-triazole (hereinafter referred to as TAZ) as a host material for a phosphorescent organic EL device is proposed in the patent document 3; however, the light-emitting range is displaced toward the side of the hole-transporting layer as TAZ has a property of facilitating the flow of electrons and obstructing the flow of holes. Hence, the luminous efficiency from Ir(ppy)3 may drop depending upon the compatibility of the material used for the hole-transporting layer with Ir(ppy)3. For example, 4,4'-bis[N-(1-naphthyl)-N-phenylamino]biphenyl (hereinafter referred to as α-NPD) that is a material most widely used as a hole-transporting layer for its excellent performance, high reliability, and long life shows poor compatibility with Ir(ppy)3 and problems arise in that energy transition occurs from TAZ to α-NPD, the efficiency of energy transition from Ir(ppy)3 to Ir(ppy)3 drops, and the luminous efficiency drops.

As a means to solve the aforementioned problem, a material to which energy transition from Ir(ppy)3 does not occur, for example, 4,4'-bis[N,N'-(3-toluoyl)amino]-3,3'-dimethylbiphenyl (hereinafter referred to as HMTPD), is used for the hole-transporting material. It is reported in the non-patent document 1 that a phosphorescent EL device of a three-layer structure consisting of a light-emitting layer comprising TAZ, 1,3-bis(N,N-t-butyl-phenyl)-1,3,4-oxazole, or BCP as a host material and Ir(ppy)3 as a guest material, an electron-transporting layer comprising Alq3, and a hole-transporting layer comprising HMTPD can emit light at high efficiency and a system using TAZ performs particularly well. However, HMTPD tends to crystallize easily as it has a glass transition temperature (Tg) of approximately 50° C. and lacks reliability as a material for the hole-transporting layer. Thus, a device comprising HMTPD faces problems such as extremely short life, difficulty of commercial application, and high driving voltage.

The patent document 1 discloses an organic EL device comprising a light-emitting layer containing a host material and a phosphorescent doping material and cites Ir (ppy)3 and a tris complex in which Ir is coordinated to a ligand having a phenyl-substituted benzothiazole structure as examples of such doping materials.

DISCLOSURE OF THE INVENTION

Problems to be Solved by the Invention

In applications of organic EL devices to display devices such as flat panel displays, it is necessary to improve the luminous efficiency of the device and, at the same time, to fully secure the driving stability of the device. An object of this invention is to provide an organic EL device which performs at high efficiency for a long period of time and can be constructed in a simple structure.

Means to Solve the Problems

This invention relates to an organic EL device comprising an anode, organic layers containing a hole-transporting layer, a light-emitting layer, and an electron-transporting layer, and a cathode piled one upon another on a substrate with the hole-transporting layer disposed between the light-emitting layer and the anode and the electron-transporting layer disposed between the light-emitting layer and the cathode wherein the light-emitting layer comprises an organic metal complex represented by the following general formula (I) as a host material and an organic metal complex represented by the following general formula (II) as a guest material.

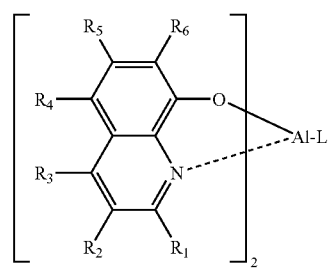

In general formula (I), each of $R_1$ to $R_6$ is independently a hydrogen atom, an alkyl group, an aralkyl group, an alkenyl group, a cyano group, an alkoxy group, a substituted or unsubstituted aromatic hydrocarbon group, or a substituted or unsubstituted aromatic heterocyclic group and L is a monovalent group represented by the following general formula (1), (2), (3), or (4)

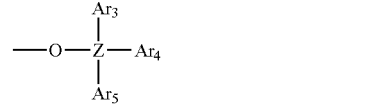

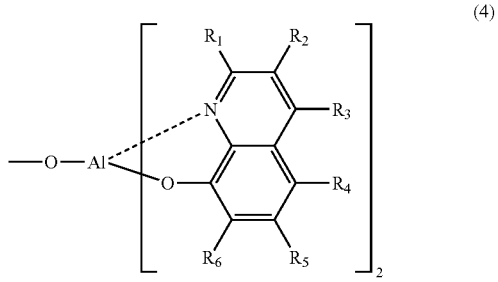

wherein each of $Ar_1$ to $Ar_5$ is independently a substituted or unsubstituted aromatic hydrocarbon group or a substituted or unsubstituted aromatic heterocyclic group, Z is silicon or germanium, and $R_1$ to $R_6$ are as defined in general formula (I).

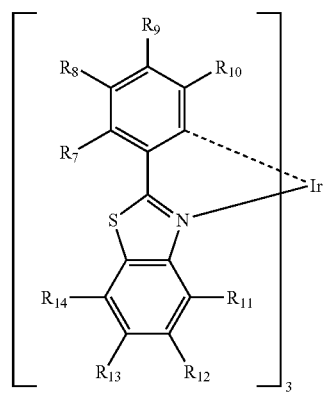

In general formula (II), each of $R_7$ to $R_{14}$ is independently a hydrogen atom, an alkyl group, an aralkyl group, an alkenyl group, a cyano group, an alkoxy group, a substituted or unsubstituted aromatic hydrocarbon group, or a substituted or unsubstituted aromatic heterocyclic group.

The organic EL device of this invention is an organic EL device utilizing phosphorescence and comprises an organic metal complex represented by the aforementioned general formula (I) (also referred to as an Al complex) and an organic metal complex represented by the aforementioned general formula (II) (also referred to as an Ir complex). The Al complex represented by general formula (I) is used as a host material and the Ir complex represented by general formula (II) is used as a phosphorescent guest material.

The host material here means a material which accounts for 50 wt % or more of the materials constituting the light-emitting layer while the guest material means a material which accounts for less than 50 wt % of the materials constituting the light-emitting layer. In the organic EL device of this invention, it is fundamentally necessary that the energy of excited triplet level of the Al complex is higher than that of the phosphorescent Ir complex in the light-emitting layer.

Further, the Al complex desirably forms a thin film of stable shape, has a high Tg, and can transport holes and/or electrons efficiently. Still further, the Al complex is required to be stable electrochemically and chemically and difficulty produce impurities which become traps or quench light during fabrication or use of the device. It is also important that the Al complex has an ability to inject holes in such a manner as to keep the light-emitting range at a suitable distance from the interface of the hole-transporting layer in order to minimize the influence of the excited triplet level of the hole-transporting layer on emission of light from the phosphorescent organic complex.

The Al complex represented by the aforementioned general formula (I) satisfies these requirements and it is used as a host material in the light-emitting layer in this invention. In general formula (I), each of $R_1$ to $R_6$ is independently a hydrogen atom, an alkyl group, an aralkyl group, an alkenyl group, a cyano group, an alkoxy group, a substituted or unsubstituted aromatic hydrocarbon group, or a substituted or unsubstituted aromatic heterocyclic group. Examples of the alkyl group include alkyl groups of 1 to 6 carbon atoms (hereinafter referred to as lower alkyl group), examples of the aralkyl group include benzyl and phenetyl, examples of the alkenyl group include lower alkenyl groups of 1 to 6 carbon atoms, and the alkyl moiety of the alkoxy group is preferably a lower alkyl group.

Examples of the aromatic hydrocarbon group include phenyl, naphthyl, and anthryl and examples of the aromatic heterocyclic group include pyridyl, quinolyl, thienyl, carbazolyl, indolyl, and furyl. In the case where these groups are substituted, examples of the substituent group include lower alkyl, lower alkoxy, phenoxy, benzyloxy, phenyl, and naphthyl.

The compounds represented by general formula (I) wherein $R_1$ to $R_6$ are hydrogen atoms, lower alkyl groups, or lower alkoxy groups are preferably chosen.

In general formula (I), L is a group represented by the aforementioned general formula (1), (2), (3), or (4) wherein each of $Ar_1$ to $Ar_5$ is independently a substituted or unsubstituted aromatic hydrocarbon group or a substituted or unsubstituted aromatic heterocyclic group and Z is silicon or germanium. Preferable examples of $Ar_1$ and $Ar_2$ include a phenyl group, a naphthyl group, and an alkyl- or aryl-substituted aromatic hydrocarbon group; the alkyl substituent is preferably a lower alkyl group such as methyl and the aryl substituent is phenyl, naphthyl, or lower alkyl-substituted phenyl or naphthyl. Preferable examples of $Ar_3$ to $Ar_5$ include phenyl or lower alkyl-substituted phenyl. The groups $R_1$ to $R_6$ in general formula (4) are as defined in the aforementioned general formula (I).

The Al complex represented by general formula (I) is synthesized, for example, by the complexation reaction of the corresponding metal salt with a 2:1 mixture on a molar basis of a compound represented by general formula (III) and a compound represented by formula (1'), (2'), or (3'). The groups $R_1$ to $R_6$ in general formula (III) correspond to $R_1$ to $R_6$ in general formula (I) and $Ar_1$ to $Ar_5$ and Z in formulas (1'), (2'), and (3') correspond to $Ar_1$ to $Ar_5$ and Z in general formula (I).

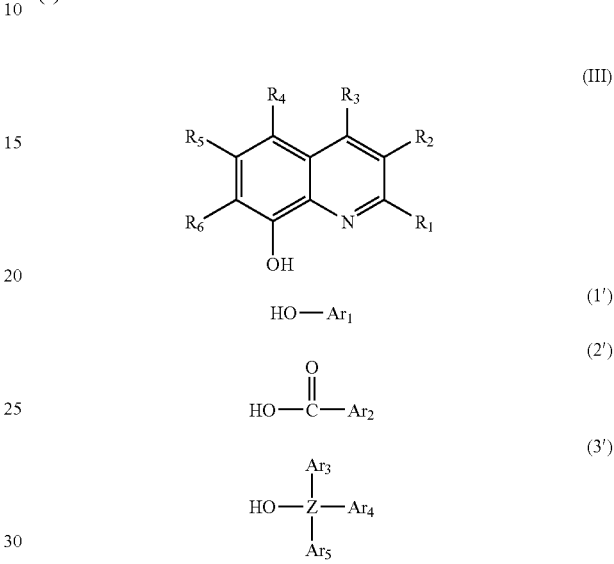

The Al complex represented by general formula (I) wherein L is expressed by general formula (4) is synthesized by the complexation reaction of the corresponding metal salt with a compound represented by general formula (III). The reaction is carried out, for example, according to the procedure described by Y. Kushi and coworkers (J. Amer. Chem. Soc., Vol. 92, p. 91, 1970).

Examples of the Al complex represented by general formula (I) are shown below, but they are not limited to the compounds listed. Hereinafter, compound 1 is expressed as BmqAl and compound 11 as BAlq for short.

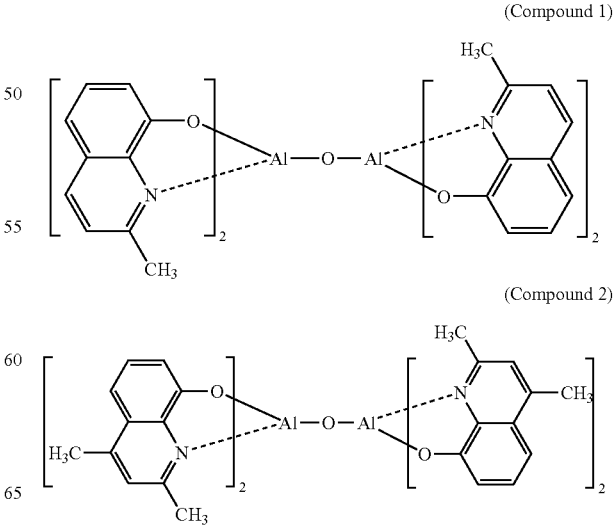

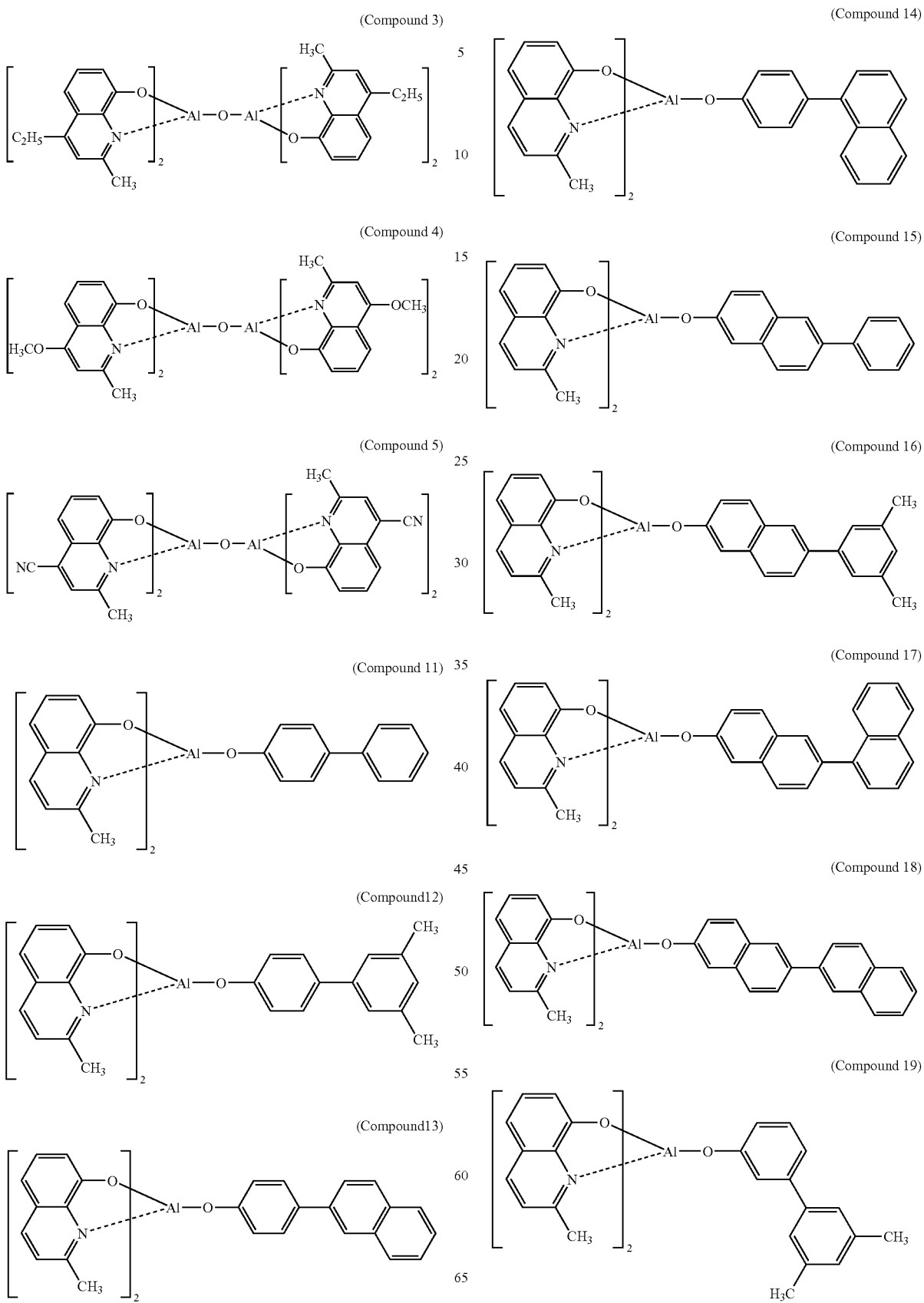

(Compound 20)

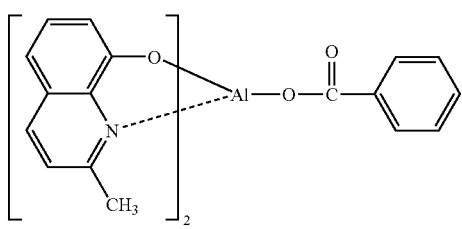

(Compound 21)

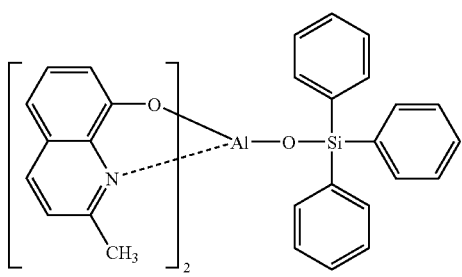

(Compound 22)

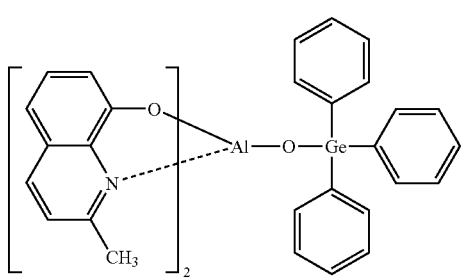

The Ir complex represented by the aforementioned general formula (II) is used as a guest material in the light-emitting layer.

In general formula (II), each of $R_7$ to $R_{14}$ is independently a hydrogen atom, an alkyl group, an aralkyl group, an alkenyl group, a cyano group, an alkoxy group, a substituted or unsubstituted aromatic hydrocarbon group, or a substituted or unsubstituted aromatic heterocyclic group. The adjacent groups $R_7$ and $R_8$, $R_8$ and $R_9$, $R_9$ and $R_{10}$, $R_{11}$ and $R_{12}$, $R_{12}$ and $R_{13}$, or $R_{13}$ and $R_{14}$ may form a ring which may be an aromatic ring.

Preferably, examples of the alkyl group include an alkyl group of 1 to 6 carbon atoms (hereinafter referred to as lower alkyl group), examples of the aralkyl group include benzyl and phenetyl, examples of the alkenyl group include a lower alkenyl group of 1 to 6 carbon atoms, and the alkyl moiety of the alkoxy group is preferably a lower alkyl group.

Preferably, examples of the aromatic hydrocarbon group include phenyl, naphthyl, acenaphthyl, and anthryl and examples of the aromatic heterocyclic group include pyridyl, quinolyl, thienyl, carbazolyl, indolyl, and furyl. In the case where the aromatic hydrocarbon group or aromatic heterocyclic group is substituted, examples of the substituent group include lower alkyl, lower alkoxy, phenoxy, benzyloxy, phenyl, and naphthyl.

A preferable example of the Ir complexes is Irbt3. Examples of the organic metal complexes represented by general formula (II) are shown below, but they are not limited to those listed. It is to be noted that compound 31 is expressed as Irbt3 for short.

(Compound 31)

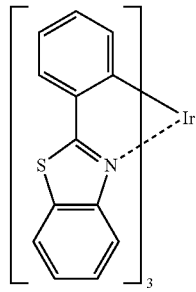

(Compound 32)

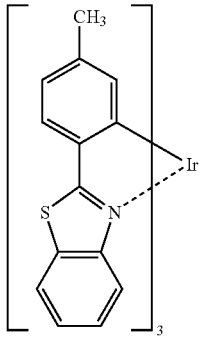

(Compound 33)

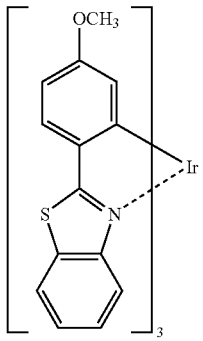

(Compound 34)

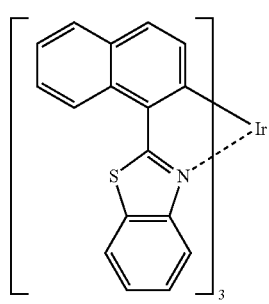

(Compound 35)

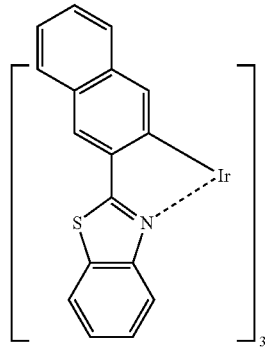

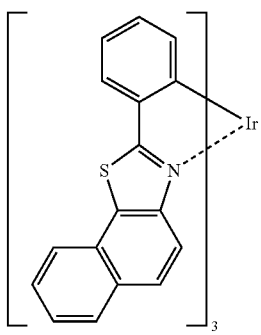

(Compound 36)

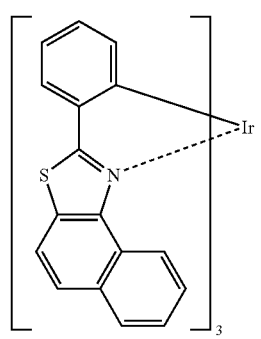

(Compound 37)

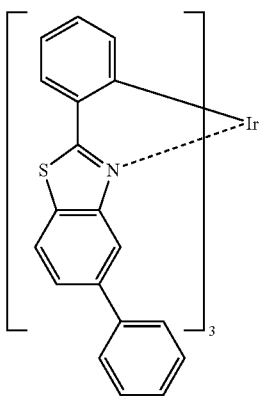

(Compound 38)

The host material to be used in the light-emitting layer in this invention allows electrons and holes to flow roughly evenly and, as a result, emission of light occurs in the center of the light-emitting layer. Therefore, the situation is different from the case of TAZ where emission of light occurs on the side of the hole-transporting layer and energy transition to the hole-transporting layer occurs with the resultant drop of luminous efficiency or from the case of CPB where emission of light occurs on the side of the electron-transporting layer and energy transition to the electron-transporting layer occurs with the resultant drop of luminous efficiency. Hence, it is possible to use α-NPD in the hole-transporting layer and Alq3 in the electron-transporting layer, both being known as highly reliable materials.

BRIEF DESCRIPTION OF THE DRAWING

FIG. 1 A schematic cross section of an example of organic electroluminescent device.

EXPLANATION OF SYMBOLS

1 Substrate; 2 anode; 3 hole-injecting layer; 4 hole-transporting layer; 5 light-emitting layer; 6 electron-transporting layer; 7 cathode.

PREFERRED EMBODIMENTS OF THE INVENTION

The organic EL device of this invention will be described below with reference to the drawing. FIG. 1 schematically illustrates the cross section of a structure generally used for an organic EL device in this invention. The organic EL device of this invention comprises a substrate 1, an anode 2, a hole-transporting layer 4, a light-emitting layer 5, an electron-transporting layer 6, and a cathode 7 as essential layers; other non-essential layers, for example, a hole-injecting layer 3, may be omitted and, if necessary, other layers may be added. However, the organic EL device of this invention does not necessarily require a hole-blocking layer. Omission of the hole-blocking layer simplifies the layered structure and offers advantages in fabrication and performance.

The substrate 1 serves as a support of an organic electroluminescent device and is made from a quartz or glass plate, a metal plate or foil, or a plastic film or sheet. Particularly desirable is a glass plate or a transparent sheet of a synthetic resin such as polyester, polymethacrylate, polycarbonate, and polysulfone. In the case where a substrate made from a synthetic resin is used, attention must be paid to the gas barrier property of the substrate. When the gas barrier property of the substrate is poor, the air may pass through the substrate to degrade undesirably the organic electroluminescent device. One of the preferable remedial procedures is to provide a dense silicon oxide film on at least one side of the synthetic resin substrate to secure the necessary gas barrier property.

The anode 2 is provided on the substrate 1 and it plays a role of injecting holes into the hole-transporting layer. The anode is usually constructed of a metal such as aluminum, gold, silver, nickel, palladium, and platinum, a metal oxide such as oxide of indium and/or tin, a metal halide such as copper iodide, carbon black, or an electrically conductive polymer such as poly(3-methylthiophene), polypyrrole, and polyaniline. The anode is usually formed by a technique such as sputtering and vacuum deposition. When the anode is formed from fine particles of silver, copper iodide, carbon black, an electrically conductive metal oxide, or an electrically conductive polymer, the particles are dispersed in a solution of a suitable binder resin and applied to the substrate 1 to form the anode 2. In the case of an electrically conductive polymer, it is possible to form the anode by forming a thin film of the polymer directly on the substrate by electrolytic polymerization of the corresponding monomer or by coating the substrate with the electrically conductive polymer. The anode may also be formed by piling different materials one upon another. The anode varies in thickness with the requirement for transparency. Where transparency is required, the transmittance of visible light is kept usually at 60% or more, preferably at 80% or more, and the thickness in such a case is usually 5 to 1000 nm, preferably 10 to 500 nm. Where opaqueness is tolerated, the anode 2 may be the same as the substrate 1. Further, it is possible to laminate a different electrically conductive material on the aforementioned anode.

The hole-transporting layer 4 is provided on the anode 2. The hole-injecting layer 3 may be disposed between the hole-transporting layer and the anode. The material selected for the hole-transporting layer is required to inject holes from the anode efficiently and to transport the injected holes efficiently. To satisfy this requirement, the material must have the following properties: it has low ionization potential; it is highly transparent against visible light; it shows high hole mobility; it is highly stable and disinclined to generate impurities that become traps during fabrication and use of the device. Further, as the material is placed in contact with the light-emitting layer 5, it must not quench light from the light-emitting layer nor form exciplexes with the light-emitting layer to lower the luminous efficiency. Besides the aforementioned general requirements, good heat resistance is required where application to vehicle display devices is considered. Hence, the material preferably has a Tg of 85° C. or above.

A known triarylamine dimer such as α-NPD can be used as a hole-transporting material in the organic EL device of this invention.

If necessary, other known compounds can be used together with a triarylamine dimer as a hole-transporting material. For example, such other known compounds include aromatic diamines containing two tertiary amines whose nitrogen atoms are substituted with two or more condensed aromatic rings, aromatic amines of a starburst structure such as 4,4', 4''-tris(1-naphthylphenylamino)triphenylamine, an aromatic amine consisting of a tetramer of triphenylamine, and spiro compounds such as 2,2',7,7'-tetrakis-(diphenylamino)-9,9'-spirobifluorene. These compounds may be used singly or as a mixture.

Besides the aforementioned compounds, the materials useful for the hole-transporting layer include polymeric materials such as polyvinylcarbazole, polyvinyltriphenylamine, and polyaryleneethersulfones containing tetraphenylbenzidine.

When the coating process is used in forming the hole-transporting layer, a coating solution is prepared by dissolving one kind or more of hole-transporting materials and, if necessary, adding binder resins and additives such as coating property improvers that do not become traps of holes and the solution is applied to the anode 2 by a process such as spin coating and dried to form the hole-transporting layer 4. The binder resins here include polycarbonate, polyarylate, and polyester. Addition of a binder resin in a large amount lowers the hole mobility and it is preferably kept at a low level, usually below 50 wt %.

When the vacuum deposition process is used in forming the hole-transporting layer, the selected hole-transporting material is introduced to a crucible placed in a vacuum container, the container is evacuated to $1 \times 10^{-4}$ Pa or so by a suitable vacuum pump, the crucible is heated to evaporate the hole-transporting material, and the hole-transporting layer 4 is formed on the anode-covered substrate which is placed opposite the crucible. The thickness of the hole-transporting layer is usually 5 to 300 nm, preferably 10 to 100 nm. The vacuum deposition process is commonly used in forming a thin film such as this uniformly.

The light-emitting layer 5 is provided on the hole-transporting layer 4. The light-emitting layer comprises the Al complex represented by general formula (I) and the Ir complex represented by general formula (II) and, on application of an electrical field between the electrodes, the holes that are injected from the anode and migrating through the hole-transporting layer recombine with the electrons that are injected from the cathode and migrating through the electron-transporting layer to get excited and emit intense light. The light-emitting layer 5 may contain other host materials (functioning in the same manner as the complex represented by general formula (I)) and other components such as fluorescent colorants to the extent that they do not damage the performance of this invention.

The content of the Ir complex represented by general formula (II) in the light-emitting layer is preferably in the range of 0.1 to 30 wt %. A content of less than 0.1 wt % does not contribute to enhancement of the luminous efficiency of the device while a content in excess of 30 wt % causes concentration quenching due to dimerization of Ir complex molecules to lower the luminous efficiency. There are indications that it is preferable to use the Ir complex in an amount somewhat larger than that of a fluorescent colorant (dopant) contained in the light-emitting layer in a conventional device utilizing phosphorescence (singlet). The Ir complex may be contained partially or distributed nonuniformly in the direction of film thickness in the light-emitting layer. The thickness of the light-emitting layer 5 is normally 10 to 200 nm, preferably 20 to 100 nm. The light-emitting layer is formed in thin film in the same manner as in the case of the hole-transporting layer.

To enhance the luminous efficiency of the device still further, the electron-transporting layer 6 is disposed between the light-emitting layer 5 and the cathode 7. The electron-transporting layer is formed from a compound that can transport the electrons injected from the cathode toward the light-emitting layer efficiently when an electrical field is applied to the electrodes. A compound useful for the electron-transporting layer 6 is required to have an ability of injecting electrons from the cathode 7 efficiently and transporting the injected electrons efficiently.

The electron-transporting materials satisfying this requirement include metal complexes such as Alq3, 10-hydroxybenzo[h]quinoline metal complexes, oxadiazole derivatives, distyrylbiphenyl derivatives, silole derivatives, 3- or 5-hydroxyflavone metal complexes, benzoxazole metal complexes, benzothiazole metal complexes, trisbenzimidazolylbenzene, quinoxaline compounds, phenanthroline derivatives, 2-t-butyl-9,10—N,N'-dicyanoanthraquinonediimine, n-type hydrogenated amorphous silicon carbide, n-type zinc sulfide, and n-type zinc selenide. The thickness of the electron-transporting layer 6 is normally 5 to 200 nm, preferably 10 to-100 nm. The electron-transporting layer is formed on the light-emitting layer by coating or vacuum deposition as in the formation of the hole-transporting layer. The vacuum deposition process is normally used.

A practice adopted for the purposes of enhancing the efficiency of hole injection still further and improving the adhesive strength of the organic layers as a whole to the anode is interposing the hole-injecting layer 3 between the hole-transporting layer 4 and the anode 2. The interposition of the hole-injecting layer 3 is effective for lowering the initial driving voltage of the device and, at the same time, suppressing a rise in voltage when the device is driven continuously at a constant current density. A material useful for the hole-injecting layer must satisfy the following requirements: it produces a close contact with the anode; it can form a uniform thin film; it is thermally stable, that is, it has a melting point of 300° C. or above and a glass transition temperature of 100° C. or above; it has low ionization potential to facilitate injection of holes from the anode; and it shows a high hole mobility.

The materials reportedly capable of achieving this end include phthalocyanine compounds such as copper phthalocyanine, organic compounds such as polyaniline and polythiophene, sputtered carbon membranes, and metal oxides such as vanadium oxide, ruthenium oxide, and molybdenum oxide. The hole-injecting layer can be formed in thin film in the same manner as for the hole-transporting layer. A method such as sputtering, electron beam evaporation, and plasma CVD can additionally be used in forming films from inorganic materials. The thickness of the anode buffer layer 3 thus formed is normally 3 to 100 nm, preferably 5 to 50 nm.

The electron-transporting layer 6 is provided on the light-emitting layer 5 and it is better not to dispose a hole-blocking layer between them.

The cathode 7 plays a role of injecting electrons into the light-emitting layer 5. The aforementioned material useful for the anode 2 may be used for the cathode, but a metal of low work function such as tin, magnesium, indium, calcium, aluminum, and silver or an alloy thereof is preferably used for efficient injection of electrons. Concrete examples are electrodes formed from alloys of low work function such as magnesium-silver alloys, magnesium-indium alloys, and aluminum-lithium alloys. The thickness of the cathode is usually the same as that of the anode. A metal of high work function and good stability in air is laminated to the cathode made from a metal of low work function for protection of the cathode and ultimate improvement of the stability of the device. A metal such as aluminum, silver, copper, nickel, chromium, gold, and platinum is used for this purpose.

The interposition of an ultrathin insulating film (0.1 to 5 nm) of LiF, $MgF_2$, $LiO_2$, or the like as an electron-injecting layer between the cathode 7 and the electron-transporting layer 6 is effective for enhancing the efficiency of the device.

It is possible to construct a device having a structure which is the reverse of the structure shown in FIG. 1, that is, the cathode 7, the electron-transporting layer 6, the light-emitting layer 5, the hole-transporting layer 4, and the anode 2 can be piled one upon another in this order on the substrate 1. As described earlier, it is also possible to disposed the organic EL device of this invention between two substrates at least one of which is highly transparent. In this case, it is also possible to add or omit a layer or layers if necessary.

The organic EL device of this invention can be applied to a single device, a device with its structure arranged in array, or a device in which the anode and the cathode are arranged in X—Y matrix. The organic EL device of this invention produces remarkable improvements in luminous efficiency and driving stability over the conventional devices utilizing emission of light from the singlet state by incorporating a compound of specific skeleton and a phosphorescent metal complex in its light-emitting layer and it can perform excellently when applied to full-color or multicolor panels.

EXAMPLES

This invention will be described in detail below with reference to the Synthetic Examples and Examples and will not be limited to the description of the examples unless its scope is exceeded.

Example 1

Copper phthalocyanine (CuPC) as a hole-injecting material, α-NPD as a hole-transporting material, and Alq3 as an electron-transporting material were piled one upon another in thin film by vacuum deposition at a degree of vacuum of $5.0 \times 10^{-4}$ Pa on a glass substrate on which an anode consisting of a 110 nm-thick ITO film had been formed. First, CuPC was deposited on the ITO anode at a rate of 3.0 Å/sec to a thickness of 25 nm to form a hole-injecting layer. Then, α-NPD was deposited on the hole-injecting layer at a rate of 3.0 Å/sec to a thickness of 55 nm to form a hole-transporting layer.

Following this, a light-emitting layer was formed on the hole-transporting layer by codepositing BmqAl (compound 1) and $Irbt_3$ (compound 31) from different evaporation sources to a thickness of 47.5 nm. The concentration of $Irbt_3$ at this time was 7.0%.

An electron-transporting layer was then formed by depositing Alq3 at a rate of 3.0 Å/sec to a thickness of 30 nm. Further, lithium oxide ($Li_2O$) was deposited on the electron-transporting layer at a rate of 0.1 Å/sec to a thickness of 1 nm to form an electron-injecting layer. Finally, aluminum (Al) as a cathode was deposited on the electron-injecting layer at a rate of 10 Å/sec to a thickness of 100 nm to complete the fabrication of an organic EL device.

Example 2

An organic EL device was fabricated as in Example 1 with the exception of codepositing BAlq (compound 11) and $Irbt_3$ (compound 31) from different evaporation sources to a thickness of 47.5 nm to form the light-emitting layer. The concentration of $Irbt_3$ was 7.0%.

Comparative Example 1

An organic EL device was fabricated as in Example 1 with the exception of using $bt_2Ir(acac)$ as the guest material of the light-emitting layer. It is noted here that $bt_2Ir(acac)$ has a structure obtained by replacing one bt of $Irbt_3$ with acac (acetylacetonate).

Comparative Example 2

An organic EL device was fabricated as in Example 2 with the exception of using $bt_2Ir(acac)$ as the guest material of the light-emitting layer.

Comparative Example 3

An organic EL device was fabricated as in Example 1 with the exception of using BCP as the host material of the light-emitting layer.

Comparative Example 4

An organic EL device was fabricated as in Example 1 with the exception of using BCP as the host material and $bt_2Ir$ (acac) as the guest material of the light-emitting layer.

The peak wavelength of emitted light, maximum luminous efficiency, and half-life of luminance (initial luminance, 500 $cd/m^2$) of the organic EL devices fabricated in Examples and Comparative Examples are shown in Table 1.

TABLE 1

|  | Peak wavelength of emitted light (nm) | Maximum luminous efficiency (cd/A) | Half-life of luminance (hr) |
| --- | --- | --- | --- |
| Ex. 1 | 554 | 11.0 | 1000 |
| Ex. 2 | 554 | 11.4 | 1000 |
| Comp. ex. 1 | 554 | 10.5 | 800 |
| Comp. ex. 2 | 554 | 10.5 | 800 |
| Comp. ex. 3 | 555 | 9.2 | 300 |
| Comp. ex. 4 | 554 | 8.5 | 200 |

INDUSTRIAL APPLICABILITY

An organic EL device which can be driven for a long period of time with maintenance of good luminous properties can be obtained according to this invention. The organic EL device is applicable to flat panel displays (for example, office computers and wall-hanging television sets), vehicle display devices, cellular phone displays, light sources utilizing the characteristics of planar light emitters (for example, light sources of copiers and backlight sources of liquid crystal displays and instruments), signboards, and beacon lights and has a high technical value.

What is claimed is:

1. An organic electroluminescent device comprising an anode, organic layers containing a hole-transporting layer, a light-emitting layer, and an electron-transporting layer, and a cathode piled one upon another on a substrate with the hole-transporting layer disposed between the light-emitting layer and the anode and the electron-transporting layer disposed between the light-emitting layer and the cathode wherein the light-emitting layer comprises an organic metal complex represented by the following general formula (I) as a host material and an organic metal complex represented by general formula (II) as a guest material:

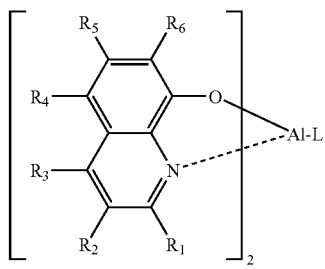

(I)

in general formula (I), each of $R_1$ to $R_6$ is independently a hydrogen atom, an C1-C6 alkyl group, an C1-C6 alkoxy group and L is a monovalent group represented by the following general formula (1) or (4)

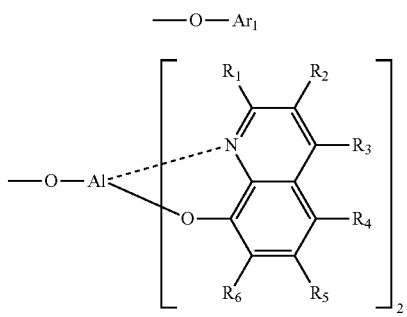

(1)

(4)

wherein each of $Ar_1$ is a substituted or unsubstituted phenyl group or a substituted or unsubstituted naphthyl group, wherein when $Ar_1$ is substituted, the substituent is independently a C1-C6 alkyl group, a phenyl group, a naphthyl group, or a phenyl group substituted at the 3- and 5-positions with methyl groups, and $R_1$ to $R_6$ are as defined above; in general formula (II),

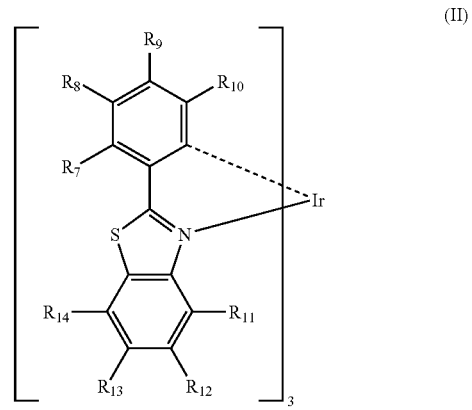

(II)

wherein, each of $R_7$ to $R_{14}$ is independently a hydrogen atom, an C1-C6 alkyl group, an aralkyl group, an C1-C6 alkoxy group, or phenyl group.

2. The organic electroluminescent device as described in claim 1 wherein an electron-injecting layer is disposed between the cathode and the electron-transporting layer.

3. The organic electroluminescent device as described in claim 1 wherein a hole-injecting layer is disposed between the anode and the hole-transporting layer.

4. The organic electroluminescent device as described in claim 3 wherein an electron-injecting layer is disposed between the cathode and the electron-transporting layer.

5. An organic electroluminescent device comprising an anode, organic layers containing a hole-transporting layer, a light-emitting layer, and an electron-transporting layer, and a cathode piled one upon another on a substrate with the hole-transporting layer disposed between the light-emitting layer and the anode and the electron-transporting layer disposed between the light-emitting layer and the cathode wherein the light-emitting layer comprises BmqAl as a host material and Irbt$_3$ as a guest material.

6. An organic electroluminescent device comprising an anode, organic layers containing a hole-transporting layer, a light-emitting layer, and an electron-transporting layer, and a cathode piled one upon another on a substrate with the hole-transporting layer disposed between the light-emitting layer and the anode and the electron-transporting layer disposed between the light-emitting layer and the cathode wherein the light-emitting layer comprises BAlq as a host material and Irbt$_3$ as a guest material.

* * * * *